(12) United States Patent
Lee et al.

(10) Patent No.: US 11,280,842 B2
(45) Date of Patent: Mar. 22, 2022

(54) BATTERY MANAGEMENT APPARATUS AND METHOD

(71) Applicant: LG CHEM, LTD., Seoul (KR)

(72) Inventors: Eun-Ju Lee, Daejeon (KR); Yoon-Jung Bae, Daejeon (KR); Yong-Jun Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 1 day.

(21) Appl. No.: 16/769,500

(22) PCT Filed: Sep. 11, 2019

(86) PCT No.: PCT/KR2019/011871
§ 371 (c)(1),
(2) Date: Jun. 3, 2020

(87) PCT Pub. No.: WO2020/055190
PCT Pub. Date: Mar. 19, 2020

(65) Prior Publication Data
US 2021/0190878 A1    Jun. 24, 2021

(30) Foreign Application Priority Data

Sep. 12, 2018  (KR) .......................... 10-2018-0109210
Sep. 10, 2019  (KR) .......................... 10-2019-0112316

(51) Int. Cl.
*G01R 31/392* (2019.01)
*G01R 31/3835* (2019.01)
(Continued)

(52) U.S. Cl.
CPC ....... *G01R 31/392* (2019.01); *G01R 31/3648* (2013.01); *G01R 31/3835* (2019.01); *G01R 31/367* (2019.01)

(58) Field of Classification Search
CPC .................................................. G01R 31/392
(Continued)

(56) References Cited

U.S. PATENT DOCUMENTS

2004/0008031 A1 * 1/2004 Arai ..................... H01M 10/48
324/429
2013/0278221 A1 * 10/2013 Maeda ................... B60L 58/15
320/134
(Continued)

FOREIGN PATENT DOCUMENTS

CN    106707175 A    5/2017
JP    11-250929 A    9/1999
(Continued)

OTHER PUBLICATIONS

International Search Report issued in corresponding International Patent Application No. PCT/KR2019/011871, dated Dec. 26, 2019.
(Continued)

*Primary Examiner* — Ricky Go
(74) *Attorney, Agent, or Firm* — Morgan, Lewis & Bockius LLP (57) ABSTRACT

The present disclosure relates to a battery management apparatus and method, which sets a degraded SOC region based on a SOC-based voltage difference between a charging voltage and a discharging voltage according to a SOC of a battery and estimates a degree of degradation of the battery based on the voltage difference in the set degraded SOC region.

14 Claims, 6 Drawing Sheets

(51) Int. Cl.
*G01R 31/36* (2020.01)
*G01R 31/367* (2019.01)

(58) Field of Classification Search
USPC .......................................................... 702/63
See application file for complete search history.

(56) References Cited

U.S. PATENT DOCUMENTS

| | | | |
|---|---|---|---|
| 2014/0009123 | A1 | 1/2014 | Park et al. |
| 2014/0088898 | A1 | 3/2014 | Lim |
| 2016/0011274 | A1* | 1/2016 | Morita .................... B60L 58/16 702/63 |
| 2016/0093927 | A1* | 3/2016 | Marcicki ............. H01M 10/482 429/50 |
| 2016/0299197 | A1* | 10/2016 | Kim ..................... G01R 31/367 |
| 2017/0010327 | A1 | 1/2017 | Nishiguchi et al. |
| 2017/0371000 | A1* | 12/2017 | Fukushima .......... G01R 31/382 |
| 2018/0059192 | A1 | 3/2018 | Seo et al. |
| 2018/0164384 | A1 | 6/2018 | Kwon et al. |

FOREIGN PATENT DOCUMENTS

| | | |
|---|---|---|
| JP | 2008-179284 A | 8/2008 |
| JP | 2012-57956 A | 3/2012 |
| JP | 5011007 B2 | 8/2012 |
| KR | 10-2011-0034997 A | 4/2011 |
| KR | 10-2011-0053001 A | 5/2011 |
| KR | 10-2012-0120889 A | 11/2012 |
| KR | 10-2015-0033267 A | 4/2015 |
| KR | 10-2015-0048439 A | 5/2015 |
| KR | 10-2016-0051327 A | 5/2016 |
| KR | 10-2017-0022746 A | 3/2017 |
| KR | 10-1738601 B1 | 5/2017 |

OTHER PUBLICATIONS

Extended European Search Report dated Nov. 6, 2020, issued in corresponding European Patent Application No. 19860512.3.
Office Action dated Jul. 15, 2021, issued in corresponding Korean Patent Application No. 10-2019-0112316.

* cited by examiner

BATTERY MANAGEMENT APPARATUS AND METHOD

TECHNICAL FIELD

The present application claims priority to Korean Patent Application No. 10-2018-0109210 filed on Sep. 12, 2018 and Korean Patent Application No. 10-2019-0112316 filed on Sep. 10, 2019 in the Republic of Korea, the disclosures of which are incorporated herein by reference.

The present disclosure relates to a battery management apparatus and method, and more particularly, to a battery management apparatus and method for estimating a degree of degradation and an expected life of a battery using various kinds of active materials.

BACKGROUND ART

A secondary battery generates electric energy through electrochemical oxidation and reduction reactions and is used in a wide variety of applications. For example, the use area of the secondary battery is gradually expanding to portable devices capable of being carried in a human hand, such as a cellular phone, a laptop computer, a digital camera, a video camera, a tablet computer, or a power tool; various electricity-driven devices such as an electric bicycle, an electric motorcycle, an electric vehicle, a hybrid electric vehicle, an electric boat, or an electric plane; power storage devices used for storing power generated by renewable energy or surplus generated power; power supply devices for stably supplying power to various information communication devices including a server computer and a base station for communication; and the like.

The secondary battery includes three basic components, namely a negative electrode (anode) containing a substance that is oxidized while discharging electrons during discharge, a positive electrode (cathode) containing a substance that is reduced while accepting electrons during discharge, and an electrolyte that allows ion transfer between the negative electrode and the positive electrode. The battery may be classified as a primary battery that is not reusable after being discharged and a secondary battery that allows repeated charging and discharging since the electrochemical reaction is at least partly reversible.

Examples of secondary batteries known in the art include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries, and the like. Among them, the lithium secondary batteries have attracted the greatest commercial interest due to their high energy density, high battery voltage and long life, compared to other secondary batteries.

Recently, for high capacity, a secondary battery having electrodes made of various kinds of electrode active materials has been developed. For example, a secondary battery having a negative electrode active material made of silicon and graphite has a higher capacity and a higher energy density, compared to a secondary battery having a negative electrode active material made of only one kind of material.

The secondary battery having an electrode made of various kinds of electrode active materials has charge and discharge characteristics different for each electrode active material. For example, in the secondary battery having a negative electrode active material made of silicon and graphite, silicon causes more active chemical reactions than graphite in a low-capacity region, and graphite causes more active chemical reactions than silicon in a high-capacity region.

Due to the charge and discharge characteristics of the secondary battery having an electrode made of various kinds of electrode active materials, the degree of degradation of the secondary battery may not be accurately estimated using the conventional method in which the degree of degradation is estimated by comparing a voltage according to a capacity with a reference voltage.

Therefore, a technique for accurately estimating the degree of degradation of a secondary battery having an electrode made of various kinds of electrode active materials is required.

DISCLOSURE

Technical Problem

The present disclosure is directed to providing a battery management apparatus and method, which calculates a SOC-based voltage difference between a charging voltage and a discharging voltage according to a SOC (State Of Charge) of a battery, sets a degraded SOC region based on the SOC-based voltage difference, and estimates a degree of degradation of the battery based on the SOC-based voltage difference of the degraded SOC region in which the corresponding SOC among the SOC-based voltage differences is included.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to an aspect of the present disclosure may comprise: a sensing unit configured to measure a charging voltage according to a SOC (State Of Charge) of a battery when the battery is charged and to measure a discharging voltage according to the SOC of the battery when the battery is discharged; and a processor configured to calculate a SOC-based voltage difference between the charging voltage according to the SOC and the discharging voltage according to the SOC, set a degraded SOC region based on the SOC-based voltage difference, and estimate a degree of degradation of the battery based on at least one of a degraded region voltage difference corresponding to a SOC included in the degraded SOC region among the SOC-based voltage differences and the number of charge and discharge cycles of the battery in the degraded SOC region.

The processor may be configured to calculate a voltage difference ratio of each of the SOC-based voltage differences to a first voltage difference having a greatest voltage difference among the SOC-based voltage differences, and set the degraded SOC region by comparing the calculated voltage difference ratio with a reference ratio.

The processor may be configured to set a region including a SOC corresponding to a voltage difference ratio equal to or greater than the reference ratio among the calculated voltage difference ratios as the degraded SOC region.

The processor may be configured to compare a charging and discharging c-rate at charging and discharging of the battery with a reference c-rate, and change the reference ratio with the comparison result.

The processor may be configured to reduce the reference ratio when the charging and discharging c-rate is equal to or greater than the reference c-rate, and increase the reference ratio when the charging and discharging c-rate is less than the reference c-rate.

The processor may be configured to calculate an average voltage difference of the degraded region voltage differences, and estimate the degree of degradation of the battery by comparing the average voltage difference with a first reference voltage difference.

The processor may be configured to estimate a reduction ratio of the average voltage difference to the first reference voltage difference as the degree of degradation of the battery.

The processor may be configured to estimate the degree of degradation of the battery by comparing a second voltage difference corresponding to a greatest SOC among the degraded region voltage differences with a second reference voltage difference.

The processor may be configured to estimate a reduction ratio of the second voltage difference to the second reference voltage difference as the degree of degradation of the battery.

The processor may be configured to accumulatively calculate the number of entire charge and discharge cycles of the battery and the number of degraded charge and discharge cycles in the degraded SOC region, respectively, calculate a number ratio between the number of degraded charge and discharge cycles and the number of entire charge and discharge cycles, and estimate an expected life by increasing or decreasing an initial expected life corresponding to the number ratio.

The processor may be configured to change an available voltage range of the battery according to the estimated degree of degradation of the battery.

The processor may be configured to select a SOC corresponding to a first voltage difference having a greatest voltage difference among the SOC-based voltage differences, and change at least one of an uppermost value and a lowermost value of the available voltage range of the battery based on the selected SOC and the estimated degree of degradation of the battery.

The processor may be configured to increase a reduction width of the available voltage range of the battery as the estimated degree of degradation of the battery is greater.

A battery pack according to another aspect of the present disclosure may comprise the battery management apparatus according to an aspect of the present disclosure.

A battery management method according to another aspect of the present disclosure may comprises: a charging voltage measuring step of measuring a charging voltage according to a SOC of a battery when the battery is charged; a discharging voltage measuring step of measuring a discharging voltage according to the SOC of the battery when the battery is discharged; a voltage difference calculating step of calculating a SOC-based voltage difference between the charging voltage according to the SOC and the discharging voltage according to the SOC; a degraded SOC region setting step of setting a degraded SOC region based on the SOC-based voltage difference; and a degree-of-degradation estimating step of estimating a degree of degradation of the battery based on at least one of a degraded region voltage difference corresponding to a SOC included in the degraded SOC region among the SOC-based voltage differences and the number of charge and discharge cycles of the battery in the degraded SOC region.

Advantageous Effects

According to the present disclosure, it is possible to calculate a SOC-based voltage difference between a charging voltage and a discharging voltage according to a SOC (State Of Charge) of a battery, set a degraded SOC region based on the SOC-based voltage difference, and accurately estimate a degree of degradation of the battery based on the SOC-based voltage difference of the degraded SOC region in which the corresponding SOC among the SOC-based voltage differences is included.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
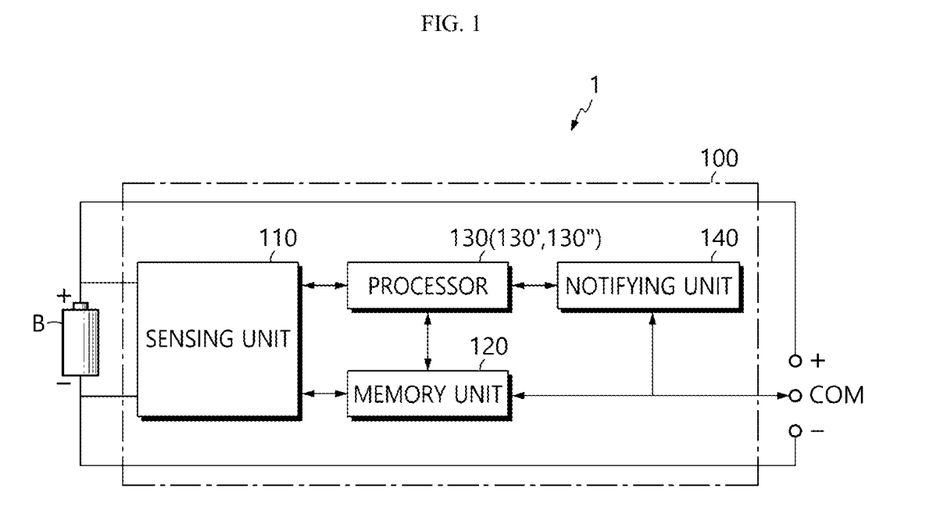
FIG. 1 is a diagram showing a battery management apparatus according to an embodiment of the present disclosure.
Figure 2:
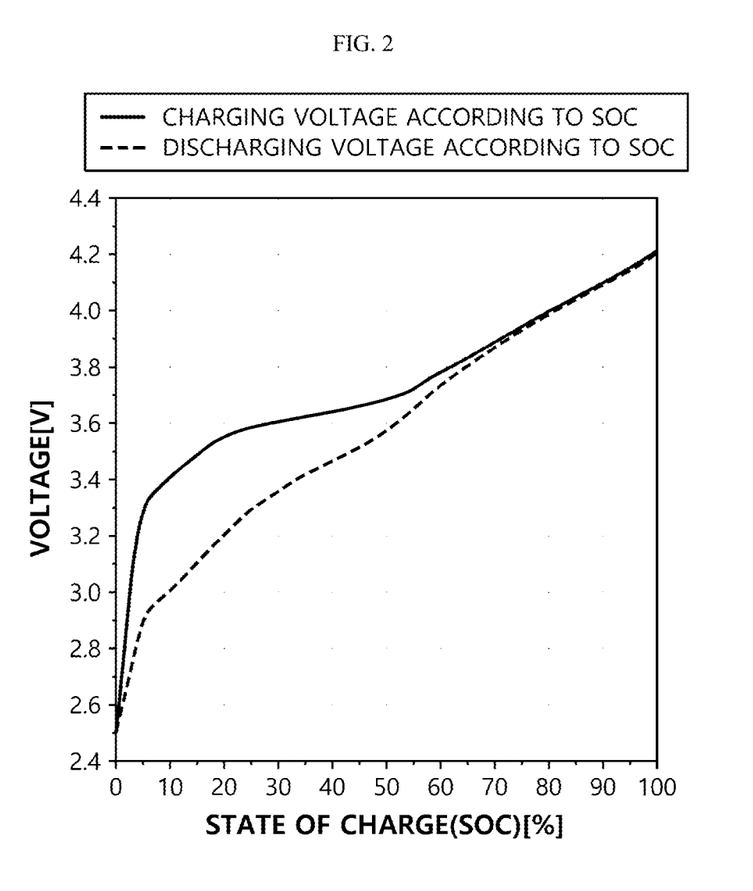
FIG. 2 is a graph showing a charging voltage and a discharging voltage of a battery according to a SOC of the battery.
Figure 3:
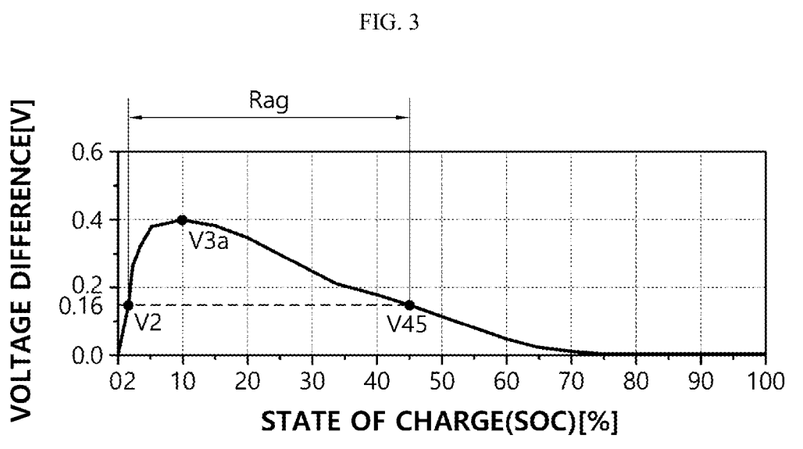
FIG. 3 is a graph showing an example of a SOC-based voltage difference between the charging voltage and the discharging voltage of the battery according to the SOC of the battery.

FIG. 1 is a diagram showing a battery management apparatus 100 according to an embodiment of the present disclosure, FIG. 2 is a graph showing a charging voltage and a discharging voltage of a battery B according to a SOC of the battery B, and FIG. 3 is a graph showing an example of a SOC-based voltage difference between the charging voltage and the discharging voltage of the battery B according to the SOC of the battery B.

First, referring to FIG. 1, the battery management apparatus 100 according to an embodiment of the present disclosure is provided in a battery pack 1 including the battery B and may be connected to the battery B to estimate a degree of degradation of the battery B.

Meanwhile, the battery management apparatus 100 according to an embodiment of the present disclosure may be included in a battery management system (BMS) provided in the battery pack 1.

The battery B is a minimum unit cell whose state of charge (SOC) is estimated, and includes a plurality of unit cells electrically connected in series and/or in parallel. Of course, the case where the battery pack B includes only one unit cell also falls into the scope of the present disclosure.

In the battery B, at least one of a positive electrode and a negative electrode may be made of various kinds of active materials. For example, the negative electrode of the battery B may be made of an active material containing graphite and silicon.

The battery B may be electrically coupled to various types of external devices through an external terminal. The external device may be, for example, an electric vehicle, a hybrid electric vehicle, a flying object such as a drone, a large-capacity energy storage system (ESS) included in an electrical grid, or a mobile device.

The external terminal of the battery B may be selectively coupled to a charging device. The charging device may be selectively coupled to the battery B by the control of the external device to which the battery pack B is mounted.

Referring to FIGS. 1 to 3, the battery management apparatus 100 according to an embodiment of the present disclosure may include a sensing unit 110, a memory unit 120, a processor 130 and a notifying unit 140.

The sensing unit 110 is operably coupled to the processor 130. That is, the sensing unit 110 may be connected to the processor 130 to transmit an electrical signal to the processor 130 or receive an electrical signal from the processor 130.

The sensing unit 110 may repeatedly measure a charging voltage applied between the positive electrode and the negative electrode of the battery B at predetermined cycles when the battery B is being charged, and repeatedly measure a discharging voltage applied between the positive electrode and the negative electrode of the battery B at predetermined cycles when the battery B is being discharged.

Here, the charging voltage and the discharging voltage of the battery B may be an open circuit voltage of the battery B.

The sensing unit 110 may repeatedly measure a charging current flowing into the battery B when the battery B is being charged, and repeatedly measure a discharge current flowing out of the battery B when the battery B is being discharged.

The sensing unit 110 may provide a measurement signal indicating the measured charging voltage, the measured discharging voltage, the measured charging current and the measured discharging current to the processor 130.

The sensing unit 110 may further include a voltage sensor configured to measure the charging voltage and the discharging voltage of the battery B. In addition, the sensing unit 110 includes a current sensor configured to measure a charging current and a discharging current of the battery B.

If the measurement signal is received from the sensing unit 110, the processor 130 may determine digital values of the charging voltage, the discharging voltage, the charging current and the discharge current of the battery B through signal processing, respectively. In addition, the processor 130 may store the determined digital values of the charging voltage, the discharging voltage, the charging current and the discharge current of the battery B in the memory unit 120.

The memory unit 120 is a semiconductor memory device that records, erases and updates data generated by the processor 130, and stores a plurality of program codes prepared for estimating a SOC of the battery B. In addition, the memory unit 120 may store preset values of various predetermined parameters used in implementing the present disclosure.

The memory unit 120 may is not particularly limited as long as it is a semiconductor memory element known in the art as being capable of recording, erasing and updating data. For example, the memory unit 120 may be DRAM, SDRAM, a flash memory, ROM, EEPROM, a register, and the like. In addition, the memory unit 120 may further include a storage medium that stores program codes defining the control logics of the processor 130. The storage medium includes a non-volatile storage element such as a flash memory or a hard disk. The memory unit 120 may be physically separate from the processor 130 or may be integrated with the processor 130.

The processor 130 may estimate a SOC (State Of Charge) of the battery B based on the charging current input to the battery B and the discharging current output from the battery B.

Here, the SOC of the battery B may be a ratio of a charging capacity to a total capacity of the battery B. For example, the SOC may be represented by the range of 0% to 100%, or may be represented by the range of 0 to 1.

The processor 130 may estimate the SOC of the battery B by using a current integration method that integrates the charging current and the discharging current of the battery B.

Although the processor 130 is described as estimating the SOC of the battery B using the current integration method, it should be noted that the estimation method is not limited as long as the SOC of the battery B can be estimated.

Meanwhile, the processor 130 may generate SOC-voltage data of the battery B by mapping the charging voltage and the discharging voltage of the battery B with the estimated SOC of the battery B.

To this end, the sensing unit 110 may measure the charging voltage according to the SOC of the battery B when the battery B is charged, and measure the discharging voltage according to the SOC of the battery B when the battery B is discharged.

In other words, if the battery B is being charged, the sensing unit 110 may measure the charging voltage at the time when the SOC of the battery B is estimated. In addition, if the battery B is being discharged, the sensing unit 110 may measure the discharging voltage at the time when the SOC of the battery B is estimated.

The SOC-voltage data of the battery B may be, as shown in FIG. 2, represented by a charging voltage curve and a discharging voltage curve of the battery B according to the SOC of the battery B.

In this case, the memory unit 120 may store the SOC-voltage data of the battery B in the form of at least one of an approximation function that approximates the SOC-voltage data of the battery B to the charging voltage curve and the discharging voltage curve of the battery B according to the SOC of the battery B and a look-up table in which the charging voltage and the discharging voltage of the battery B are mapped for each SOC of the battery B.

The processor 130 may calculate a SOC-based voltage difference between the charging voltage according to the SOC and the discharging voltage according to the SOC, set a degraded SOC region based on the SOC-based voltage difference, and estimate a degree of degradation of the battery based on a degraded region voltage difference of the degraded SOC region in which the corresponding SOC is included among the SOC-based voltage differences.

Specifically, as shown in FIG. 3, the processor 130 may calculate the voltage difference between the charging voltage and the discharging voltage according to the same SOC in the entire SOC region of "0% to 100%".

In this case, the processor 130 may calculate the SOC-based voltage difference between the charging voltage according to the SOC and the discharging voltage according to the SOC using Equation 1 below.

$$\Delta V_{(SOCn)} = V_{ch(SOCn)} - V_{dis(SOCn)}$$ [Equation 1]

Here, $\Delta V_{(SOCn)}$ represents a voltage difference of the charging voltage and the discharging voltage at SOC n %, $V_{ch(SOCn)}$ represents a charging voltage at SOC n %, $V_{dis(SOCn)}$ represents a discharging voltage at SOC n %, and n represents 0% to 100%.

For reference, if the negative electrode active material of the battery B is made of silicon and graphite, the SOC-based voltage difference may vary depending on the contents of silicon and graphite. Specifically, the battery B having a negative electrode active material in which the silicon content is greater than the graphite content may have a greater SOC-based voltage difference than the battery B having a negative electrode active material in which the graphite content is greater than the silicon content.

In addition, the SOC-based voltage difference may vary depending on the degree of degradation of the battery B. Specifically, as the battery B is degraded further, the SOC-based voltage difference may become smaller.

The battery management apparatus 100 according to the present disclosure may estimate the degree of degradation and the expected life of the battery B by using the change of the SOC-based voltage difference that is caused by the contents of negative electrode materials forming the negative electrode active material of the battery B and the degree of degradation of the battery B.

The processor 130 may calculate a voltage difference ratio of each SOC-based voltage difference to a first voltage difference (Va) having a greatest voltage difference among the SOC-based voltage differences, and set a degraded SOC region (Rag) by comparing the voltage difference ratio with a reference ratio.

As shown in FIG. 3, among the voltage differences respectively corresponding SOC "0% to 100%", the processor 130 may select a voltage difference "0.4V" corresponding to SOC "10%" as the first voltage difference (Va). After that, the processor 130 may calculate a voltage difference ratio of each of the other SOC-based voltage differences to the first voltage difference (Va).

In this case, the processor 130 may calculate the voltage difference ratio using Equation 2 below.

$$R_{v(SOCn)} = \Delta V_{(SOCn)} \div Va$$ [Equation 2]

Here, $R_{v(SOCn)}$ represents a voltage difference ratio at SOC n %, $\Delta V_{(SOCn)}$ represents a voltage difference of the charging voltage and the discharging voltage at SOC n %, Va represents a first voltage difference having a greatest voltage difference among the SOC-based voltage differences, and n represents 0% to 100%.

For example, as shown in FIG. 3, the processor 130 may calculate a voltage difference ratio at SOC "45%". Here, the voltage difference (V45) at SOC "45%" may be "0.16V". The processor 130 may calculate the voltage difference ratio of the voltage difference (V45) "0.16V" to the first voltage difference (V3a) "0.4V" as "0.4".

In addition, the processor 130 may calculate a voltage difference ratio at SOC "2%". Here, the voltage difference (V2) at SOC "2%" may be "0.16V". The processor 130 may calculate the voltage difference ratio of the voltage difference (V2) "0.16V" to the first voltage difference (V3a) "0.4V" as "0.4".

The processor 130 may calculate the voltage difference ratio in the entire region of SOC "0% to 100%" according to the above method.

Subsequently, the processor 130 may set a region where the calculated voltage difference ratio is equal to or greater than the reference ratio as a degraded SOC region (Rag). Specifically, the processor 130 may compare the calculated voltage difference ratio with the reference ratio and set a region including SOC where the voltage difference ratio is equal to or greater than the reference ratio according to the comparison result as the degraded SOC region (Rag).

For example, in the embodiment of FIG. 3, it is assumed that the reference ratio is set to "0.4". The processor 130 may compare the voltage difference ratio calculated for each SOC with the reference ratio "0.4". After that, the processor 130 may set a SOC region "2% to 45%" corresponding to the voltage difference ratio equal to or greater than the reference ratio of "0.4" as the degraded SOC region (Rag).

Meanwhile, in the degraded SOC region (Rag), among the various kinds of negative electrode active materials forming the negative electrode of the battery B, one kind of negative electrode active material, which generates a voltage difference between the charging voltage and the discharging voltage, may more actively cause chemical reactions. Accordingly, the degraded SOC region (Rag) may be a SOC region in which the voltage difference between the charging voltage and the discharging voltage of the battery B is equal to or greater than a specific voltage.

In an embodiment, the negative electrode of the battery B is made of silicon and graphite, and if the battery B is charged and discharged in the degraded SOC region (Rag), silicon generating a voltage difference between the charging voltage and the discharging voltage may more actively cause chemical reactions in comparison to graphite. Thus, in the degraded SOC region (Rag), the voltage difference between the charging voltage and the discharging voltage of the battery B may be equal to or greater than a certain voltage.

In addition, as described in the former example, as the battery B having the negative electrode made of a negative electrode active material including various kinds of materials are degraded, the voltage difference between the charging voltage and the discharging voltage of the battery B in the degraded SOC region (Rag) decreases.

Meanwhile, the processor 130 may classify a voltage difference in which the corresponding SOC is included in the SOC region (Rag) among the calculated SOC-based voltage differences as the degraded region voltage difference.

For example, as shown in FIG. 3, the processor 130 may classify the voltage difference in which the corresponding SOC is included in the degraded SOC region (Rag) "2% to 45%" among the calculated SOC-based voltage differences as the degraded region voltage difference.

After that, the processor 130 may calculate an average voltage difference of the degraded region voltage differences and estimate the degree of degradation by comparing the average voltage difference with a first reference voltage difference.

To this end, the processor 130 may calculate the average voltage difference by adding the voltage difference corresponding to each SOC included in the degraded SOC region (Rag) and dividing the added result by a SOC difference between a maximum SOC and a minimum SOC of the degraded SOC region (Rag).

For example, in the embodiment of FIG. 3, the processor 130 may calculate the average voltage difference by adding the voltage difference corresponding to each SOC included in the degraded SOC region (Rag) and dividing the added result by the SOC difference "44%" of the degraded SOC region (Rag). Here, the SOC difference "44%" of the degraded SOC region (Rag) is a size of the degraded SOC region (Rag) and may be calculated based on the minimum SOC "2%" and the maximum SOC "45%". Specifically, the processor 130 may calculate the size of the degraded SOC region (Rag) by calculating "45−2+1" (%).

The processor 130 may be configured to estimate the degree of degradation of the battery B by comparing the calculated average voltage difference with the first reference voltage difference. Specifically, the processor 130 may estimate a reduction ratio of the average voltage difference to the first reference voltage difference as the degree of degradation. That is, the processor 130 may estimate a ratio of the average voltage difference reduced based on the first reference voltage difference as the degree of degradation.

Here, the first reference voltage difference may be an average voltage difference calculated by the same method as described above from a battery in a BOL state that is not degraded. The first reference voltage difference may be obtained from the battery in a BOL state and stored in the memory unit 120 in advance.

Meanwhile, the BOL state means the beginning of life when the cycle count of the battery B is less than a predetermined value.

The processor 130 may estimate the degree of degradation of the battery B using Equation 3 below.

$$D=((R1-V_{AVR})\div R1)\times 100 \quad \text{[Equation 3]}$$

Here, D represents a degree of degradation of the battery B, R1 represents a first reference voltage difference, and $V_{AVR}$ represents an average voltage difference.

For example, if the calculated average voltage difference is "0.3V" and the first reference voltage difference is "0.35V", the processor 130 may estimate the degree of degradation of the battery B as "14.285%".

Here, degree of degradation may mean a degree of degradation of the battery B, which is a target for the estimation of the degree of degradation, relative to a battery in a BOL state.

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

The notifying unit 140 may receive and output the estimation results obtained by the processor 130 to the outside. More specifically, the notifying unit 140 may include at least one of a display unit for displaying the estimation result for the degree of degradation of the battery B by using at least one of symbols, numbers and codes, and a speaker unit for outputting the estimation result with a sound.

The notifying unit 140 may also receive an estimation result of the degree of degradation of the battery B from a processor 130' according to another embodiment, explained later, and output the estimation result to the outside. In addition, the notifying unit 140 may also receive an estimation result of the expected life of the battery B from a processor 130" according to still another embodiment, explained later, and output the estimation result to the outside.

The notifying unit 140 may output the estimated progress to an external terminal COM in order to output the estimation result to the outside.

The processor 130 may be configured to compare a charging and discharging c-rate and the reference c-rate in the charging and discharging of the battery B with a reference c-rate.

Here, the c-rate is a charge and discharge rate capable of charging or discharging the electricity corresponding to the capacity of the battery B in 1 hour. For example, if a fully charged battery B is discharged with a c-rate "1 C", the battery B may be fully discharged after 1 hour.

In addition, the reference c-rate is a c-rate corresponding to the reference ratio and may be a value stored in advance in the memory unit 120. That is, a look-up table in which a ratio corresponding to the charging and discharging c-rate is matched may be stored in the memory unit.

The processor 130 may estimate the charging and discharging c-rate based on the charge/discharge time of the battery B and the SOC.

For example, in the embodiment FIG. 2, if the charging is initiated when the initial SOC of the battery B is "0%" and the SOC of the battery B becomes "100%" after 1 hour, the processor 130 may estimate the charging c-rate as "1 C".

The processor 130 may be configured to change the reference ratio according to a result of comparing the charging and discharging c-rate with the reference c-rate. For example, if the charging and discharging c-rate is changed, the SOC-based voltage difference of the battery B may change during charging and discharging. That is, the SOC-based voltage difference may be affected by the c-rate.

Specifically, the SOC-based voltage difference according to a c-rate change will be described with reference to FIGS. 3 and 4.

Figure 4:
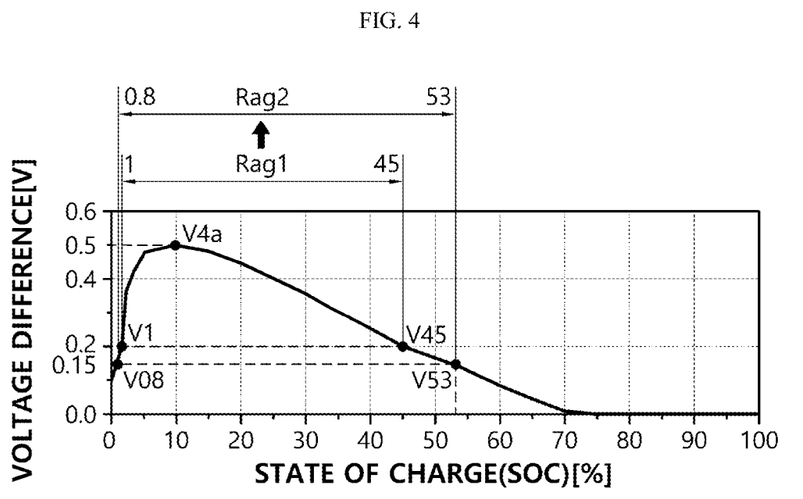
FIG. 4 is a graph showing another example of the SOC-based voltage difference between the charging voltage and the discharging voltage of the battery according to the SOC of the battery.

FIG. 4 is a graph showing another example of the SOC-based voltage difference between the charging voltage and the discharging voltage of the battery B according to the SOC of the battery B. It is assumed that the battery B is charged and discharged with a reference c-rate in FIG. 3 and the battery B is charged and discharged with a charging and discharging c-rate greater than the reference c-rate in FIG. 4.

It may be found that the first voltage difference with the greatest voltage difference among the SOC-based voltage differences is different in FIGS. 3 and 4. That is, in the example of FIG. 3, the first voltage difference (V3a) is 0.4 [V], but in the example of FIG. 4, the first voltage difference (V4a) is 0.5 [V]. That is, as the charging and discharging c-rate is greater, the difference between the SOC-based charging voltage and the SOC-based discharging voltage may be increased further.

As the charging and discharging c-rate increases, the SOC-based voltage difference becomes larger. Thus, if the degraded SOC region is set using the same reference ratio, the degree of degradation of the battery B may not be accurately estimated. For this reason, the processor 130 may change the degraded SOC region, which is the basis of estimating the degree of degradation of the battery B, by changing the reference ratio to correspond to the charging and discharging c-rate.

As in the former embodiment, it is assumed that the reference ratio is set to "0.4".

In the embodiment of FIG. 3, the first voltage difference (V3a) is "0.4 [V]", and the value obtained by multiplying the first voltage difference (V3a) by the reference ratio is "0.16 [V]". Thus, the processor 130 may set the SOC "2% to 45%" region corresponding to the SOC-based voltage difference "0.16 [V] to 0.4 [V]" as the degraded SOC region (Rag).

In the embodiment of FIG. 4, the first voltage difference (V4a) is "0.5 [V]", and the value obtained by multiplying the first voltage difference (V4a) by the reference ratio is "0.2 [V]". Thus, if the same reference ratio as in the embodiment of FIG. 3 is applied, the processor 130 may set the SOC "1% to 45%" region corresponding to "0.2 [V] to 0.5 [V]" as a degraded SOC region (Rag1). In this case, even though the first voltage difference (V4a) of the embodiment of FIG. 4 is increased by "25%" in comparison to the first voltage difference (V3a) of the embodiment of FIG. 3, the size of the degraded SOC region is set almost identically. That is, since the ratio of the charging and discharging c-rate is not considered, it may be regarded that some regions affecting the degree of degradation of the battery B are excluded from the degraded SOC region (Rag1).

Thus, in the embodiment FIG. 4, since the charging and discharging of the battery B is performed in a different c-rate than the reference c-rate, the processor 130 may change the reference ratio with reference to the look-up table stored in the memory unit 120. In addition, the SOC "0.8% to 53%" region may be set as a degraded SOC region (Rag2) according to the reference ratio changed by the processor 130.

Since the reference ratio for setting the degraded SOC region (Rag2) is changed according to the charging and discharging c-rate, the battery management apparatus 100 may more accurately estimate the degree of degradation of the battery B. In addition, since the degree of degradation of the battery B is calculated even in consideration of the charging and discharging c-rate, the reliability of the estimated degree of degradation of the battery B may be improved.

Preferably, the processor 130 may be configured to reduce the reference ratio if the charging and discharging c-rate is greater than or equal to the reference c-rate. In contrast, the processor 130 may be configured to increase the reference ratio if the charging and discharging c-rate is less than the reference c-rate.

As described above, as the charging and discharging c-rate increases, the SOC-based voltage difference may increase. That is, if the degraded SOC region (Rag1) is set as the reference ratio corresponding to the reference c-rate even though the charging and discharging c-rate is increased, some regions capable of actually affecting the degree of degradation of the battery B may be excluded.

Thus, if the charging and discharging c-rate is greater than or equal to the reference c-rate, the processor 130 may reduce the reference ratio with reference to the look-up table stored in the memory unit 120. In this case, since the range of the degraded SOC region (Rag2) is increased, the degree of degradation of the battery B may be diagnosed more accurately.

On the contrary, if the charging and discharging c-rate is less than the reference c-rate, the processor 130 may increase the reference ratio with reference to the look-up table stored in the memory unit 120. In this case, the range of the degraded SOC region may be decreased. However, since the battery B is charged and discharged at a lower charging and discharging c-rate than the reference c-rate, regions having no significant relation with the degree of degradation of the battery B are excluded, and the degraded SOC regions may be set only with regions greatly affecting the degree of degradation of the battery B. Thus, it is possible to save time and resources required for the processor 130 to estimate the degree of degradation of the battery B.

Since the reference ratio is changed based on the charging and discharging c-rate of the battery B as described above, the battery management apparatus 100 may change the size of the degraded SOC region. Thus, since the degree of degradation of the battery B is estimated in consideration of the increase and decrease of the charging and discharging c-rate, the degree of degradation of the battery B may be estimated more accurately and more reliably. In addition, since the time and resources required for estimating the degree of degradation of the battery B are saved, the degree of degradation of the battery B may be estimated efficiently.

Hereinafter, the processor 130' according to another embodiment will be described.

Figure 5:
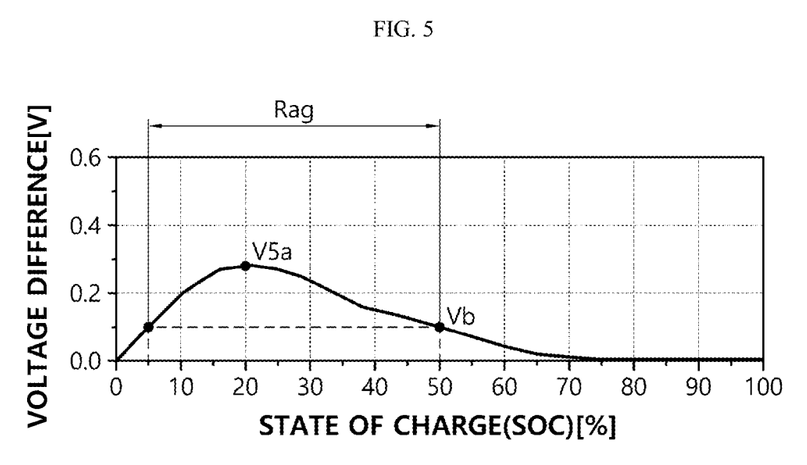
FIG. 5 is a graph showing still another example of the SOC-based voltage difference between the charging voltage and the discharging voltage of the battery according to the SOC of the battery.

FIG. 5 is a graph showing still another example of the SOC-based voltage difference between the charging voltage and the discharging voltage of the battery B according to the SOC of the battery B.

Referring to FIG. 5, the processor 130' according to another embodiment may be different from the processor 130 according to an embodiment only in view of the process of estimating the degree of degradation of the battery B. That is, the processor 130' and the processor 130 may calculate the SOC-based voltage difference, set the degraded SOC region (Rag) and classify the degraded region voltage difference identically, before estimating the degree of degradation of the battery B. Repeated description thereof will be omitted.

In the embodiment of FIG. 5, the processor 130' may determine the first voltage difference V5a having the greatest SOC-based voltage difference. In addition, the degraded SOC region (Rag) may be set based on the first voltage difference (V5a) and the reference ratio. Here, as in the former embodiment, the reference ratio may be "0.4".

The processor 130' may estimate the degree of degradation by comparing a second voltage difference (Vb) having the greatest SOC among the degraded region voltage differences with a second reference voltage difference.

In the embodiment of FIG. 5, the processor 130' may determine the greatest SOC in the degraded SOC region (Rag) as "50%". In addition, the processor 130' may select a voltage difference corresponding to the SOC "50%" as the second voltage difference (Vb).

That is, in the embodiment of FIG. 5, the processor 130' may classify the degraded region voltage difference in which the corresponding SOC is greatest among the degraded region voltage differences as the second voltage difference (Vb).

After that, the processor 130' may estimate a reduction ratio of the second voltage difference (Vb) to the second reference voltage difference as the degree of degradation. More specifically, the processor 130' may estimate the ratio of the second voltage difference (Vb) reduced based on the second reference voltage difference as the degree of degradation.

For example, in the embodiment of FIG. 5, the processor 130' may calculate the reduction ratio of the second voltage difference (Vb) to the second reference voltage difference and estimate the calculated reduction ratio as the degree of degradation of the battery B.

Here, the second reference voltage difference may be a voltage difference obtained using the same method as described above from the battery B in a BOL state that is not degraded. That is, the voltage difference obtained from the battery in the BOL state in the same way as the method in which the processor 130' according to another embodiment obtains the second voltage difference (Vb) from the battery B that is a target for the estimation of the degree of degradation may be the second reference voltage difference. The second reference voltage difference may be obtained from the battery in the BOL state and stored in the memory unit 120 in advance.

The processor 130' according to another embodiment may estimate the degree of degradation using Equation 4 below.

$$D=((R2-Vb) \div R2) \times 100 \quad \text{[Equation 4]}$$

Here, D represents a degree of degradation of the battery B, R2 represents a second reference voltage difference, Vb represents a second voltage difference.

For example, as shown in FIG. 5, the processor 130' according to another embodiment may estimate the degree of degradation by comparing the second voltage difference (Vb) "0.1V" having the greatest SOC "50%" among the degraded region voltage differences with the second reference voltage difference "0.15V". Here, as described above, the second reference voltage difference "0.15V" may be obtained from the battery in the BOL state and stored in the memory unit 120 in advance.

The processor 130' according to another embodiment may estimate the reduction ratio "33.33%" of the second voltage difference (Vb) "0.1V" to the second reference voltage difference "0.15V" as the degree of degradation of the battery B.

Hereinafter, a processor 130" according to still another embodiment of the present disclosure will be described.

Figure 6:
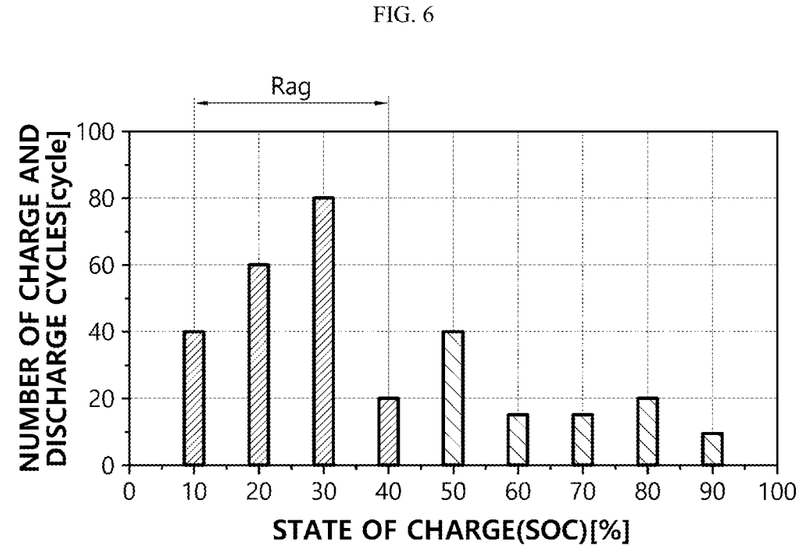
FIG. 6 is a graph showing the number of charge and discharge cycles of the battery according to the SOC of the battery.

FIG. 6 is a graph showing the number of charge and discharge cycles of the battery B according to the SOC of the battery B.

Referring to FIG. 6, the processor 130" may further estimate an expected life, compared to the processor 130. The process of setting the degraded SOC region (Rag) by calculating the SOC-based voltage difference may be the same. Repeated description thereof will be omitted.

Meanwhile, as the number of charging and discharging the battery B is increased in the degraded SOC region (Rag), a specific negative electrode active material, which generates a voltage difference between the charging voltage and the discharging voltage, may cause more frequent chemical reactions among various kinds of negative electrode active materials. In this case, the expected life of the battery B may decrease.

In other words, if the battery B is often charged and discharged in the degraded SOC region (Rag) where a specific negative electrode active material generating a voltage difference between the charging voltage and the discharging voltage among various kinds of negative electrode active materials causes more chemical reactions, the expected life of the battery B may decrease.

First, the processor 130" may accumulatively calculate the number of entire charge and discharge cycles of the battery B and the number of degraded charge and discharge cycles in the degraded SOC region, respectively.

In addition, the processor 130" may calculate a number ratio between the number of degraded charge and discharge cycles and the number of entire charge and discharge cycles. The processor 130" may estimate and change the expected life of the battery B in response to the calculated number ratio. Also, the processor 130" may calculate the degree of degradation of the battery B based on the number of entire charge and discharge cycles and the estimated expected life of the battery B.

Here, an initial expected life may be an expected life estimated from the battery in a BOL state. That is, the expected life of the battery B set as the initial expected life may be estimated and changed by the processor 130" as the battery B is charged and discharged.

First, if the battery B is charged and discharged, the processor 130" may check whether the SOC of the battery B is included in the degraded SOC region (Rag), and if the SOC is included in the degraded SOC region (Rag), the processor 130" may increase the number of degraded charge and discharge cycles. In addition, if the battery B is charged or discharged, the processor 130" may increase the number of entire charge and discharge cycles regardless of whether the SOC of the battery B is included in the degraded SOC region (Rag).

After that, the processor 130″ may calculate the number ratio of the number of degraded charge and discharge cycles to the number of entire charge and discharge cycles and estimate the expected life by decreasing the initial expected life as the number ratio increases in response to the calculated number ratio.

Specifically, the processor 130″ may estimate the expected life (L) using Equation 5 below.

$$L = L_{init} - (N_{total} + (N_{total} \times ((N_{deg} \div N_{total}) - a))) \quad \text{[Equation 5]}$$

Here, L represents an expected life, $L_{init}$ represents an initial expected life of the battery B, $N_{total}$ represents the number of entire charge and discharge cycles of the battery B, $N_{deg}$ represents the number of degraded charge and discharge cycles of the battery B, and a represents a correction constant.

The processor 130″ may calculate the number ratio $(N_{deg} \div N_{total})$ of the number of degraded charge and discharge cycles $(N_{deg})$ to the number of entire charge and discharge cycles $(N_{total})$. In addition, the processor 130″ may calculate a corrected number ratio $((N_{deg} \div N_{total}) - a)$ based on the calculated number ratio $(N_{deg} \div N_{total})$ and a correction constant (a). The processor 130″ may calculate the corrected number of entire charge and discharge cycles $(N_{total} + (N_{total} \times ((N_{deg} \div N_{total}) - a)))$ based on the corrected number ratio $((N_{deg} \div N_{total}) - a)$ and the number of entire charge and discharge cycles $(N_{total})$. Finally, the processor 130″ may calculate the expected life (L) of the battery B by subtracting the corrected number of entire charge and discharge cycles $(N_{total} + (N_{total} \times ((N_{deg} \div N_{total}) - a)))$ from the initial expected life $(L_{init})$.

For example, it is assumed that the initial expected life is "1000 cycle" and the correction constant is "0.5". Referring to FIG. 6, the number of entire charge and discharge cycles in the SOC "0% to 100%" may be "300 cycles" and the number of degraded charge and discharge cycles in the degraded SOC region (Rag) may be "200 cycles". As shown in FIG. 6, the processor 130″ may accumulatively calculate the number of entire charge and discharge cycles as "300 cycles" and calculate the number of degraded charge and discharge cycles as "200 cycles".

After that, the processor 130 may calculate "50 cycles" by multiplying the number of entire charge and discharge cycles "300 cycles" by "1/6" that is obtained by subtracting the correction constant "0.5" from the number ratio "2/3". Subsequently, the processor 130″ may estimate the expected life of the battery B as "650 cycles" by subtracting "350 cycles", which is obtained by adding the calculated "50 cycles" to the number of entire charge and discharge cycles "300 cycles", from the initial expected life "1000 cycles".

That is, the processor 130″ according to still another embodiment does not simply estimate the expected life by subtracting the number of entire charge and discharge cycles "300 cycle" from the initial expected life "1000 cycle", but rather may estimate the expected life of the battery B based on the number ratio between the number of degraded charge and discharge cycles of the battery B charged and discharged in the degraded SOC region (Rag), which accelerates degradation, and the number of entire charge and discharge cycles. For example, as in the former example, the processor 130″ may estimate the expected life of the battery B as "650 cycles" by subtracting "350 cycles", which is greater than the number of entire charge and discharge cycles "300 cycles" of the battery B, from the initial expected life "1000 cycles".

In addition, the processor 130″ may calculate the degree of degradation of the battery B by calculating a change rate between the initial expected life and the estimated expected life.

In the above embodiment, the processor 130″ may calculate the change rate between the initial expected life "1000 cycles" and the estimated expected life "650 cycles" as "35%". Here, the processor 130 may calculate the change rate between the initial expected life and the estimated expected life as "(1000−650)÷1000×100" to calculate the degree of degradation of the battery B as "35%".

The processor 130 may be configured to change an available voltage range of the battery B according to the estimated degree of degradation of the battery B.

Specifically, the battery B in the BOL state and the degraded battery B may be in different states even at the same voltage. For example, it is assumed that the battery B in the BOL state and the degraded battery B have the same voltage "4.2 [V]". The battery B in the BOL state may be in a full charge state at "4.2 [V]", but the degraded battery B may be in an overcharged state at "4.2 [V]". Accordingly, in consideration of this, the processor 130 may change the available voltage range of the battery B according to the degree of degradation of the battery B.

Figure 7:
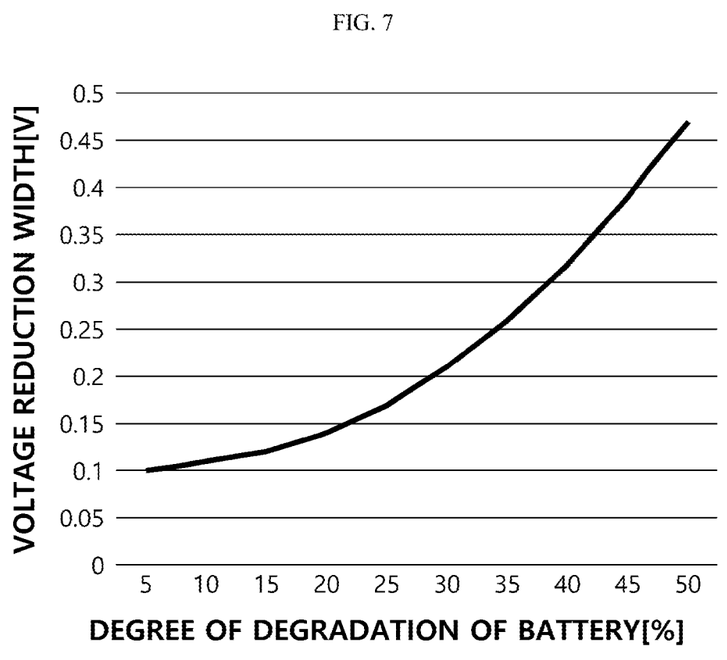
FIG. 7 is a diagram showing an example of a voltage reduction width according to the degree of degradation of the battery.

FIG. 7 is a diagram showing an example of a voltage reduction width according to the degree of degradation of the battery B. The degree of degradation of the battery B shown in FIG. 7 and a voltage reduction width corresponding thereto may be stored in the memory unit 120. The processor 130 may estimate the degree of degradation of the battery B and change the available voltage range of the battery B with reference to the voltage reduction width corresponding to the estimated degree of degradation of the battery B.

The battery management apparatus 100 may set the available voltage range corresponding to the degree of degradation of the battery B by changing the available voltage range of the battery B in consideration of the degree of degradation of the battery B. Thus, the battery management apparatus may prevent the battery B from being overdischarged or overcharged in advance.

In addition, the processor 130 may select an SOC corresponding to the first voltage difference having the greatest voltage difference among the SOC-based voltage differences.

For example, in the embodiment of FIG. 3, the processor 130 may select "0.4 [V]" as the first voltage difference (V3a). In addition, the processor 130 may select "10%" as a SOC corresponding to the first voltage difference (V3a).

The processor 130 may be configured to change at least one of an uppermost value and a lowermost value of the available voltage range of the battery B.

For example, the available voltage range of the battery B in the BOL state may be set as "2.4 [V] to 4.2 [V]". That is, if the voltage of the battery B in the BOL state is less than "2.4 [V]", the processor 130 may determine that the battery B in the BOL state is an overdischarged state. In addition, if the voltage of the battery B in the BOL state exceeds "4.2 [V]", the processor 130 may determine that the battery B in the BOL state is in an overcharged state.

Preferably, the processor 130 may change both the uppermost value and the lowermost value of the available voltage range of the battery B according to the degree of degradation of the battery B. That is, if the battery B is degraded, the processor 130 may reduce the size of the available voltage range of the battery B by decreasing the uppermost value of the available voltage range of the battery B and increasing the lowermost value thereof.

Also, preferably, the processor 130 may change the uppermost value or the lowermost value of the available voltage range of the battery B according to the region in which the SOC corresponding to the first voltage difference of the battery B is included in the SOC region.

As in the former embodiment, if "10%" is selected as the SOC corresponding to the first voltage difference (V3a), the processor 130 may increase the lowermost value of the available voltage range of the battery B based on the degree of degradation of the battery B.

For example, if the SOC corresponding to the greatest voltage difference among the SOC-based voltage differences is included in the region "equal to or greater than 0% and less than 50%", the processor 130 may increase the lowermost value of the available voltage range of the battery B based on the degree of degradation of the battery B. On the contrary, if the SOC corresponding to the greatest voltage difference among the SOC-based voltage differences is included in the region "equal to or greater than 50% and less than 100%", the processor 130 may decrease the uppermost value of the available voltage range of the battery B based on the degree of degradation of the battery B.

That is, the battery management apparatus 100 may prevent the degraded battery B from being overdischarged and/or overcharged by changing the available voltage range of the battery B according to the degree of degradation of the battery B. In particular, the battery management apparatus 100 may prevent the battery B from being overdischarged and/or overcharged by changing the uppermost value or the lowermost value of the available voltage range of the battery B based on the SOC having the greatest SOC-based voltage difference to more specifically reflect the state of the battery B.

In addition, since the battery B is prevented from being overdischarged and/or overcharged, an abnormal situation such as lithium plating or reduction of a positive electrode area may be prevented. Thus, ultimately, the use efficiency of the battery B is maximized, and an accident caused by degradation of the battery B may be prevented.

Preferably, the processor 130 may be configured to increase the reduction width of the available voltage range of the battery B as the estimated degree of degradation of the battery B increases. That is, as the degree of degradation of the battery B increases, the processor 130 may decrease the available voltage range of the battery B more and more.

For example, the processor 130 may decrease the uppermost value of the available voltage range of the battery B more and more as the degree of degradation of the battery B increases. In addition, the processor 130 may increase the lowermost value of the available voltage range of the battery B more and more as the degree of degradation of the battery B increases.

Referring to FIG. 7, it may be found that as the degree of degradation of the battery B increases, the voltage reduction width increases. That is, as the degree of degradation of the battery B increases, the reduction width of the available voltage range of the battery B may increase.

For example, in the embodiment of FIG. 7, the voltage reduction width increases by about "0.04 [V]" in the region where the degree of degradation of the battery B is "0% to 20%". However, in the region where the degree of degradation of the battery B is "20% to 40%", the voltage reduction width increases by about "0.18 [V]".

In this case, if the battery B with the degree of degradation of "0%" is degraded so that the degree of degradation of the battery B becomes "20%", the processor 130 may decrease the available voltage range of the battery B by "0.04 [V]".

Subsequently, it is assumed that the battery B having the degree of degradation of "20%" is further degraded so that the degree of degradation of the battery B becomes "40%". In this case, even though the degree of degradation of the battery B increases by "20%", similar to the case where the degree of degradation increased from "0%" to "20%", the processor 130 may decrease the available voltage range of the battery B further by "0.18 [V]. That is, the processor 130 may increase the reduction width of the available voltage range as the degree of degradation of the battery B increases.

Thus, the battery management apparatus further restricts the available voltage range of the battery B as the degree of degradation of the battery B increases, thereby more strictly preventing the battery B from being overcharged or overdischarged.

Meanwhile, a vehicle according to the present disclosure may include the battery management apparatus 100 described above. By this, it is possible to estimate the degree of degradation and the expected life of a battery provided in the vehicle.

Meanwhile, an energy storage system according to the present disclosure may include the battery management apparatus 100 described above. By this, it is possible to estimate the degree of degradation and the expected life of a battery provided in the energy storage system.

Figure 8:
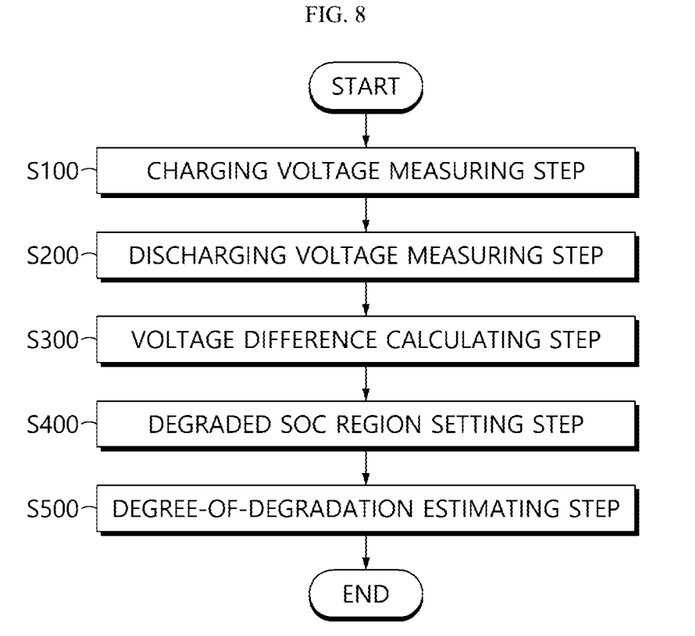
FIG. 8 is a flowchart for schematically illustrating a battery management method according to another embodiment of the present disclosure.

FIG. 8 is a flowchart for schematically illustrating a battery management method according to another embodiment of the present disclosure. The battery management method illustrated in FIG. 8 may be performed by the battery management apparatus according to an embodiment of the present disclosure.

Referring to FIG. 8, the battery management method according to another embodiment of the present disclosure may include a charging voltage measuring step S100, a discharging voltage measuring step S200, a voltage difference calculating step S300, a degraded SOC region setting step S400 and a degree-of-degradation estimating step S500.

The charging voltage measuring step S100 is a step of measuring a charging voltage according to a SOC of a battery B when the battery B is charged, which may be performed by the sensing unit 110.

When the battery B is being charged, the sensing unit 110 may repeatedly measure the charging voltage applied between the positive electrode and the negative electrode of the battery B at predetermined cycles. Specifically, the sensing unit 110 may measure the charging voltage of the battery B by measuring potentials of the positive electrode and the negative electrode of the battery B and obtaining a difference between the measured potential of the positive electrode and the measured potential of the negative electrode.

The discharging voltage measuring step S200 is a step of measuring a discharging voltage according to the SOC of the battery B when the battery B is discharged, which may be performed by the sensing unit 110.

When the battery B is being discharged, the sensing unit 110 may repeatedly measure the discharging voltage applied between the positive electrode and the negative electrode of the battery B at predetermined cycles. Specifically, the sensing unit 110 may measure the discharging voltage of the battery B by measuring potentials of the positive electrode and the negative electrode of the battery B and obtaining a difference between the measured potential of the positive electrode and the measured potential of the negative electrode.

The voltage difference calculating step S300 is a step of calculating a SOC-based voltage difference between the charging voltage according to the SOC and the discharging voltage according to the SOC, which may be performed by the processor 130.

First, the processor 130 may receive a signal regarding the measured charging and discharging voltages from the sensing unit 110 and determine the charging voltage and the discharging voltage of the battery B through signal processing.

In addition, the processor 130 may generate SOC-voltage data of the battery B by mapping the charging voltage and the discharging voltage of the battery B with the SOC of the battery B. For example, as shown in FIG. 3, the processor 130 may generate the SOC-voltage data in which the charging voltage and the discharging voltage of the battery are mapped with each SOC of the battery B.

After that, the processor 130 may calculate the SOC-based voltage difference between the charging voltage according to the SOC and the discharging voltage according to the SOC. Specifically, the processor 130 may calculate the SOC-based voltage difference by obtaining the difference between the charging voltage and the discharging voltage for the same SOC. For example, the SOC-based voltage difference calculated by the processor 130 based on the SOC-voltage data of FIG. 3 may be the SOC-based voltage difference shown in FIG. 4.

The degraded SOC region setting step S400 is a step of setting a degraded SOC region based on the SOC-based voltage difference, which may be performed by the processor 130.

Referring to FIG. 3, the processor 130 may set the degraded SOC region (Rag) by calculating a voltage difference ratio of each SOC-based voltage difference to a first voltage difference (Va) with the greatest voltage difference among the SOC-based voltage differences and comparing the calculated voltage difference ratio with a reference ratio.

For example, in the embodiment of FIG. 3, the reference ratio may be set as "40%" and the first voltage difference (Va) may be "0.4V". In this case, the processor 130 may set the SOC region "2% to 45%" corresponding to the voltage difference ratio equal to or greater than the reference ratio among the calculated voltage difference ratios as the degraded SOC region (Rag).

The degree-of-degradation estimating step S500 is a step of estimating the degree of degradation of the battery B based on at least one of the degraded region voltage difference corresponding to the SOC included in the degraded SOC region among the SOC-based voltage differences and the number of charge and discharge cycles of the battery B in the degraded SOC region, which may be performed by the processor 130.

First, the processor 130 may classify a voltage difference in which the corresponding SOC is included in the degraded SOC region (Rag) among the calculated SOC-based voltage differences into a degraded region voltage difference. In addition, the processor 130 may calculate an average voltage difference of the degraded region voltage differences and compare the calculated average voltage difference with a first reference voltage difference to estimate the degree of degradation. Here, the first reference voltage difference may be an average voltage difference calculated in the same method as described above from a battery in a BOL state that is not degraded.

For example, in the embodiment FIG. 3, if the calculated average voltage difference is "0.3V" and the first reference voltage difference is "0.35V", the processor 130 may estimate the degree of degradation of the battery B as "14.285%".

In addition, the processor 130 may accumulatively calculate the number of entire charge and discharge cycles of the battery B and the number of degraded charge and discharge cycles in the degraded SOC region (Rag), respectively. In addition, the processor 130 may calculate a number ratio between the number of degraded charge and discharge cycles and the number of entire charge and discharge cycles. The processor 130 may estimate and change the expected life of the battery B in response to the calculated number ratio. In addition, the processor 130 may calculate the degree of degradation of the battery B based on the number of entire charge and discharge cycles of the battery B and the estimated expected life.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
B: battery
100: battery management apparatus
110: sensing unit
120: memory unit
130, 130', 130": processor
140: notifying unit

What is claimed is:

1. A battery management apparatus, comprising:
a sensing unit configured to:
    measure a charging voltage according to a state of charge (SOC) of a battery when the battery is charged; and
    measure a discharging voltage according to the SOC of the battery when the battery is discharged; and
a processor configured to:
    calculate an SOC-based voltage difference between the charging voltage according to the SOC and the discharging voltage according to the SOC;
    set a degraded SOC region based on the SOC-based voltage difference; and
    estimate a degree of degradation of the battery based on at least one of:

a degraded region voltage difference corresponding to an SOC included in the degraded SOC region among the SOC-based voltage differences; and a number of charge and discharge cycles of the battery in the degraded SOC region, wherein the processor is further configured to calculate a voltage difference ratio of each of the SOC-based voltage differences to a first voltage difference having a greatest voltage difference among the SOC-based voltage differences, and to set the degraded SOC region by comparing the calculated voltage difference ratio with a reference ratio.

2. The battery management apparatus according to claim 1, wherein the processor is further configured to set a region including an SOC corresponding to a voltage difference ratio equal to or greater than the reference ratio among the calculated voltage difference ratios as the degraded SOC region.

3. The battery management apparatus according to claim 1, wherein the processor is further configured to:
compare a charging and discharging c-rate at charging and discharging of the battery with a reference c-rate; and
change the reference ratio with the comparison result.

4. The battery management apparatus according to claim 3, wherein the processor is further configured to:
reduce the reference ratio when the charging and discharging c-rate is equal to or greater than the reference c-rate; and
increase the reference ratio when the charging and discharging c-rate is less than the reference c-rate.

5. The battery management apparatus according to claim 1, wherein the processor is further configured to:
calculate an average voltage difference of the degraded region voltage differences; and
estimate the degree of degradation of the battery by comparing the average voltage difference with a first reference voltage difference.

6. The battery management apparatus according to claim 5, wherein the processor is further configured to estimate a reduction ratio of the average voltage difference to the first reference voltage difference as the degree of degradation of the battery.

7. The battery management apparatus according to claim 1, wherein the processor is further configured to estimate the degree of degradation of the battery by comparing a second voltage difference corresponding to a greatest SOC among the degraded region voltage differences with a second reference voltage difference.

8. The battery management apparatus according to claim 7, wherein the processor is further configured to estimate a reduction ratio of the second voltage difference to the second reference voltage difference as the degree of degradation of the battery.

9. The battery management apparatus according to claim 1, wherein the processor is further configured to:
accumulatively calculate the number of entire charge and discharge cycles of the battery and the number of degraded charge and discharge cycles in the degraded SOC region, respectively;
calculate a number ratio between the number of degraded charge and discharge cycles and the number of entire charge and discharge cycles; and
estimate an expected life by increasing or decreasing an initial expected life corresponding to the number ratio.

10. The battery management apparatus according to claim 1, wherein the processor is further configured to change an available voltage range of the battery according to the estimated degree of degradation of the battery.

11. The battery management apparatus according to claim 10, wherein the processor is further configured to:
select an SOC corresponding to a first voltage difference having a greatest voltage difference among the SOC-based voltage differences; and
change at least one of an uppermost value and a lowermost value of the available voltage range of the battery based on the selected SOC and the estimated degree of degradation of the battery.

12. The battery management apparatus according to claim 10, wherein the processor is further configured to increase a reduction width of the available voltage range of the battery as the estimated degree of degradation of the battery is greater.

13. A battery pack, comprising the battery management apparatus according to claim 1.

14. A battery management method, comprising:
a charging voltage measuring step of measuring a charging voltage according to a state of charge (SOC) of a battery when the battery is charged;
a discharging voltage measuring step of measuring a discharging voltage according to the SOC of the battery when the battery is discharged;
a voltage difference calculating step of calculating an SOC-based voltage difference between the charging voltage according to the SOC and the discharging voltage according to the SOC;
a degraded SOC region setting step of setting a degraded SOC region based on the SOC-based voltage difference, the degraded SOC region setting step including calculating a voltage difference ratio of each of the SOC-based voltage differences to a first voltage difference having a greatest voltage difference among the SOC-based voltage differences, and setting the degraded SOC region by comparing the calculated voltage difference ratio with a reference ratio; and
a degree-of-degradation estimating step of estimating a degree of degradation of the battery based on at least one of:
a degraded region voltage difference corresponding to an SOC included in the degraded SOC region among the SOC-based voltage differences; and
a number of charge and discharge cycles of the battery in the degraded SOC region.

* * * * *